United States Patent [19]

Zhang

[11] Patent Number: 4,914,320
[45] Date of Patent: Apr. 3, 1990

[54] SPEED-UP CIRCUIT FOR NPN BIPOLAR TRANSISTORS

[75] Inventor: Xiaonan Zhang, San Diego, Calif.
[73] Assignee: Unisys Corporation, Blue Bell, Pa.
[21] Appl. No.: 224,733
[22] Filed: Jul. 27, 1988
[51] Int. Cl.$^4$ .................. H01L 27/02; H03K 19/088
[52] U.S. Cl. .................................. 307/443; 307/455; 307/456; 357/44
[58] Field of Search ........... 357/44; 307/443, 454–456

[56] References Cited

U.S. PATENT DOCUMENTS 4,668,879 5/1987 Dansky et al. ................ 307/456

Primary Examiner—Stanley D. Miller
Assistant Examiner—Margaret Rose Wambach
Attorney, Agent, or Firm—Charles J. Fassbender; Robert S. Bramson

[57] ABSTRACT

A speed-up circuit is employed in a semiconductor chip of the type that includes a P-type substrate with a plurality of NPN transistors integrated into a surface thereof. Those transistors include a first NPN transistor having a base which receives a control signal, a collector coupled to a voltage bus, and an emitter which drives a first resistor plus a base of a second NPN transistor plus a small parasitic capacitance. The second NPN transistor has a collector coupled to a voltage bus, and an emitter which drives a second resistor plus a larger parasitic capacitance. And, the speed-up circuit is comprised of: a PNP transistor having an emitter coupled to the large capacitance, a base coupled to a tap on the first resistor, and a collector coupled to the substrate. This PNP transistor has an emitter and a base which consists of doped regions in the substrate that respectively are shaped the same as the base and collector of each NPN transistor, and the collector of the PNP transistor is the entire substrate below the NPN transistors.

11 Claims, 4 Drawing Sheets

SPEED-UP CIRCUIT FOR NPN BIPOLAR TRANSISTORS

BACKGROUND OF THE INVENTION

This invention relates to bipolar transistors; and in particular, it relates to NPN bipolar transistor logic gates and digital memories which employ various means to achieve a fast switching speed.

In the prior art, both NPN and PNP bipolar transistors have been described. NPN transistors have a collector current which is made primarily of electrons; whereas PNP transistors have a collector current which is made primarily of holes. Electrons are more mobile than holes; and thus where a high speed of operation is a major requirement, NPN transistors are better suited.

For example, in logic circuits and digital memories, high speed is a primary goal. Thus, such circuits are frequently fabricated by using NPN transistors exclusively. Also, by forming those circuits with just one type transistor (NPN), rather than both NPN and PNP, the fabrication process is simplified. This reduces cost since the number of masking steps, as well as the number of implant or diffusion steps is reduced.

However, in logic circuits and digital memories, various parasitic capacitances always exist. They arise, for example, due to the base-substrate junction of the transistor, the emitter-substrate junction of the transistor, and any conductive lines to those junctions. Such parasitic capacitances are troublesome because they limit the speed at which the logic circuits and digital memories can operate.

If a particular design of a logic circuit or digital memory is to be competitive in the marketplace, these parasitic capacitances must be effectively dealt with. Otherwise, the speed at which the circuit operates will be slower than the competition. On the other hand, whatever speed-up means is employed to deal with the parasitic capacitances, it must not be so costly as to be impractical in the marketplace.

Accordingly, a primary object of the invention is to provide an improved speed-up circuit for an NPN bipolar transistor circuit in which parasitic capacitances are effectively dealt with in terms of both switching speed and cost.

BRIEF SUMMARY OF THE INVENTION

A speed-up circuit, in accordance with the invention, is employed in a semiconductor chip of the type that includes a P-type substrate with a plurality of NPN transistors integrated into a surface thereof. Those transistors include a first NPN transistor having a base which receives a control signal, a collector coupled to a voltage bus, and an emitter which drives a first resistor plus a base of a second NPN transistor plus a small parasitic capacitance. The second NPN transistor has a collector coupled to a voltage bus, and an emitter which drives a second resistor plus a large parasitic capacitance. And, the speed-up circuit is comprised of: a PNP transistor having an emitter coupled to the large capacitance, a base coupled to a tap on the first resistor, and a collector coupled to the substrate. This PNP transistor has an emitter and a base which consists of doped regions in the substrate that respectively are shaped the same as the base and collector of each NPN transistor, and the collector of the PNP transistor is the entire substrate below the NPN transistors.

BRIEF DESCRIPTION OF THE DRAWINGS

Various features and advantages of the invention are described herein in conjunction with the accompanying drawings wherein.

DETAILED DESCRIPTION OF THE INVENTION

Figure 1:
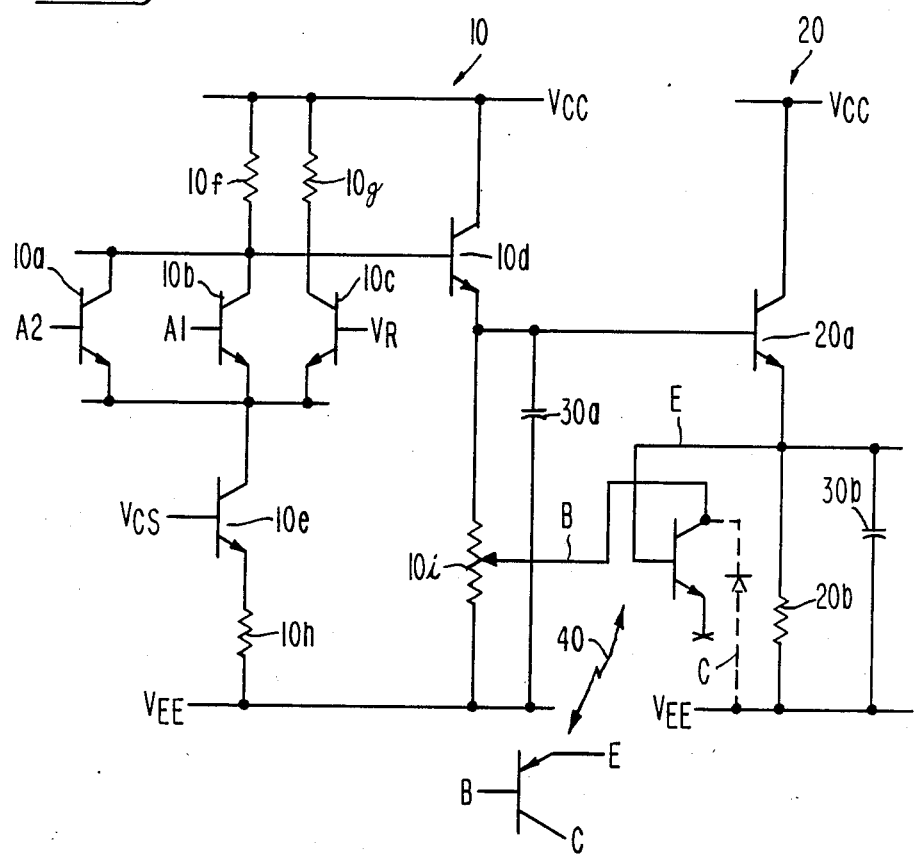
FIG. 1 is a detailed circuit diagram of a logic gate which employs the present invention.

Referring now to the figures, the details of the preferred embodiments of the invention will be described. First, beginning with FIG. 1, it shows an embodiment which includes a NOR logic gate 10 and a driver circuit 20. Gate 10 is comprised of five NPN transistors 10a thru 10e and four resistors 10f thru 10i; and driver 20 is comprised of a single NPN transistor 20a and a single resistor 20b. All of those components are fabricated in the surface of a semiconductor substrate, and they are interconnected as shown.

Also included in the FIG. 1 embodiment are two capacitors 30a and 30b. Capacitor 30a is a small parasitic component which is inherently present in the base of transistor 20a, the emitter of transistor 10d, the input terminal of resistor 10i, and their interconnections. A practical range for capacitor 30a is (0.005-0.5-)picofarads.

By comparison, capacitor 30b is at least ten times as large as capacitor 30a, and it ranges from (0.5-50-)picofarads. Capacitor 30b is a parasitic capacitor that is associated with whatever load transistor 20a drives. That load, as is explained in greater detail in conjunction with FIG. 6, can be the emitters of dozens of transistors or it can be the bases of dozens of transistors.

NOR gate 10 receives two input logic signals "A1" and "A2". When both of the signals "A1" and "A2" are low, transistor 10d turns on. That charges capacitor 30a, which turns on transistor 20a, which charges capacitor 30b. Conversely, when at least one of the signals "A1" and "A2" is high, transistor 10d turns off. That discharges capacitor 30a, which turns off transistor 20a, which discharges capacitor 30b.

Now in accordance with the invention, the FIG. 1 embodiment further includes a PNP transistor 40. This PNP transistor has an emitter E which is coupled to the large capacitor 30b, a base B which is coupled to a tap on resistor 10i, and a collector C which is coupled to the substrate bias voltage. Emitter E is built like the base of an NPN transistor; base B is built like the collector of an NPN transistor; and collector C is the bottom portion of the substrate. To indicate in FIG. 1 that the emitter E and base B of the PNP transistor 40 are respectively built like the base and collector of an NPN transistor, FIG. 1 shows that the PNP symbol for transistor 40 can be replaced with an NPN symbol provided the emitter connections of the PNP are the same as the base connections of the NPN, and the base connections of the PNP are the same as the collector connections of the NPN. This structure, for the PNP transistor 40 as will be described shortly in conjunction with FIGS. 3A thru 3C, enables the PNP transistor 40 to be fabricated along with the NPN transistors without any additional masking steps.

Figure 2:
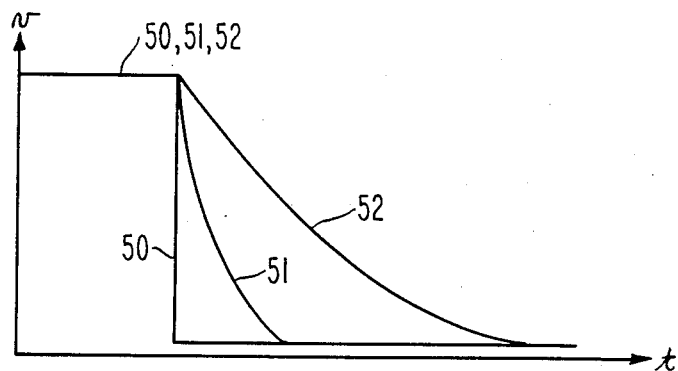
FIG. 2 illustrates the operation of the FIG. 1 circuit.

To understand the operational effect of the PNP transistor, reference should now be made to FIG. 2. There, a curve 50 illustrates how the voltage across capacitor 30b would vary ideally when transistor 20a is turned off by the logic gate 10. However, the ideal voltage waveform 50 cannot be achieved since capacitor 30b requires a certain amount of time to discharge.

In the FIG. 1 embodiment, capacitor 30b discharges through resistor 20b and transistor 40; and the resulting voltage waveform is shown in FIG. 2 as curve 51. By comparison, when the PNP transistor 40 is excluded from the FIG. 1 embodiment, the discharge of capacitor 30b occurs solely through resistor 20b; and the resulting voltage waveform is shown in FIG. 2 as curve 52.

Curves 51 and 52 show that the presence of the PNP transistor 40 reduces the switching time of the FIG. 1 circuit. This reduction occurs because capacitor 30a is smaller than capacitor 30b; and thus capacitor 30a discharges more quickly than capacitor 30b. As capacitor 30 discharges quickly, the base-emitter junction of transistor 40 becomes forward biased, and that in turn causes an emitter current to flow into transistor 40 which speeds up the discharge of capacitor 30b.

Figure 3A:
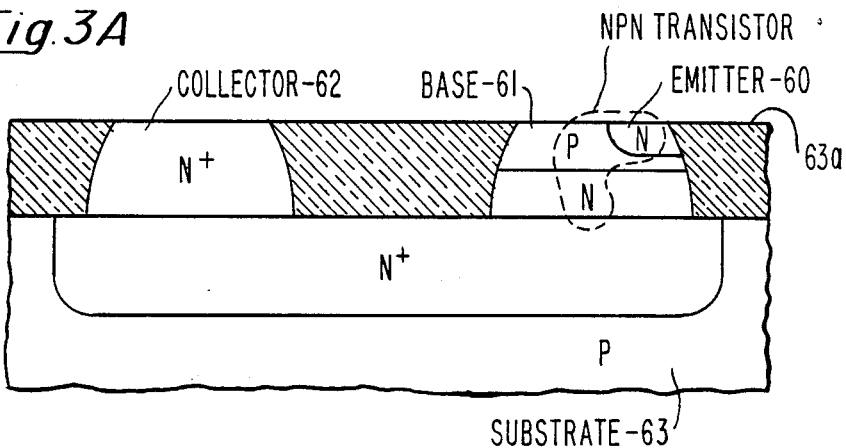
FIGS. 3A-3C show the physical structure of the transistors in the FIG. 1 circuit.
Figure 3B:
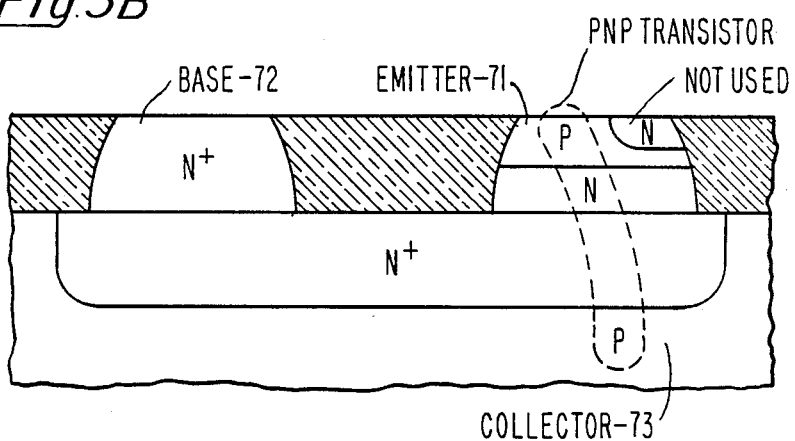
Figure 3C:
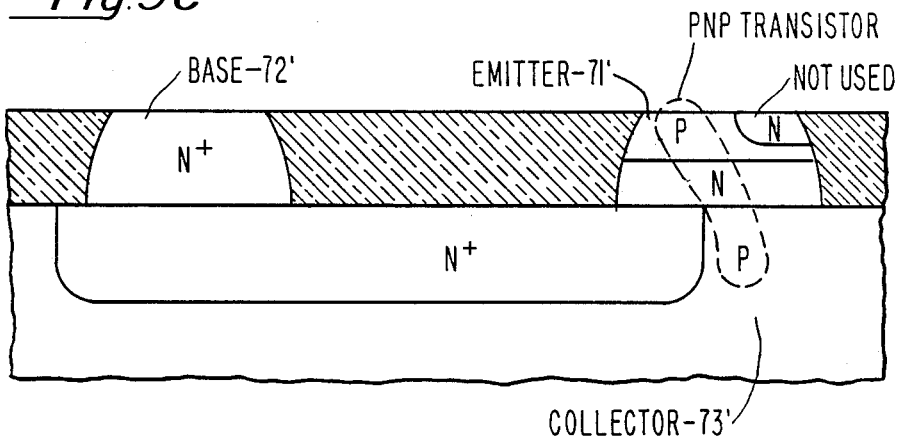

Turning now to FIGS. 3A–3C, a physical structure of the transistors in the FIG. 1 embodiment will be described. Beginning with FIG. 3A, it shows the physical structure of each of the NPN transistors 10a, 10b, 10c, 10d, 10e, and 20a. That NPN structure includes an N-type emitter region 60, a P-type base region 61, and an N-type collector region 62. These regions are formed within 10 um of the surface 63a of a P-type substrate 63, which itself is at least 200 um thick. Oxidized portions of the substrate's surface, as indicated by the hatching, separate the transistors from each other.

Considering now FIG. 3B, it shows the physical structure of one embodiment of the PNP transistor 40. That PNP structure includes a P-type emitter region 71, an N-type base region 72, and a P-type collector region 73. Collector 73 is the same as the substrate 63 in FIG. 3A, while regions 71 and 72 respectively have the same shape and doping as the previously described regions 61 and 62 of FIG. 3A.

In other words, the emitter 71 of the PNP transistor of FIG. 3B has the same physical structure as the base 61 of the NPN transistor of FIG. 3A; and the base 72 of the PNP transistor of FIG. 3B has the same physical structure as the collector 62 of the NPN transistor of FIG. 3A. This is important because it enables the PNP and NPN transistors to be fabricated by the same masking and doping steps. For example, the same mask and implant which defines the base region 61 also defines the emitter region 71.

Next, referring to FIG. 3C, it shows an alternative embodiment for the PNP transistor 40. In FIG. 3C, reference numeral 71' indicates the emitter; reference numeral 72' indicates the base; and reference numeral 73' indicates the collector. Of primary importance in this FIG. 3C structure is the fact that the base 72' includes an N-type region and an N+ region which contact each other in an offset fashion (whereas in FIG. 3B the N and N+ regions are aligned). Due to this offset, a portion of the N region directly contacts the P-type substrate 73' which, in effect, makes the base region 72' thinner.

By thinning the base of the PNP transistor as shown in FIG. 3C, the transistor's current gain is increased. Current gain is the emitter-collector current divided by the emitter-base current. With the FIG. 3 structure, a larger portion of the total emitter current will pass through the base to the collector 73' in comparison to the FIG. 3B structure. Using the FIG. 3C structure, a current gain of about 30–45 is achieved; whereas with the FIG. 3B structure, the current gain is near 1.

Figure 4:
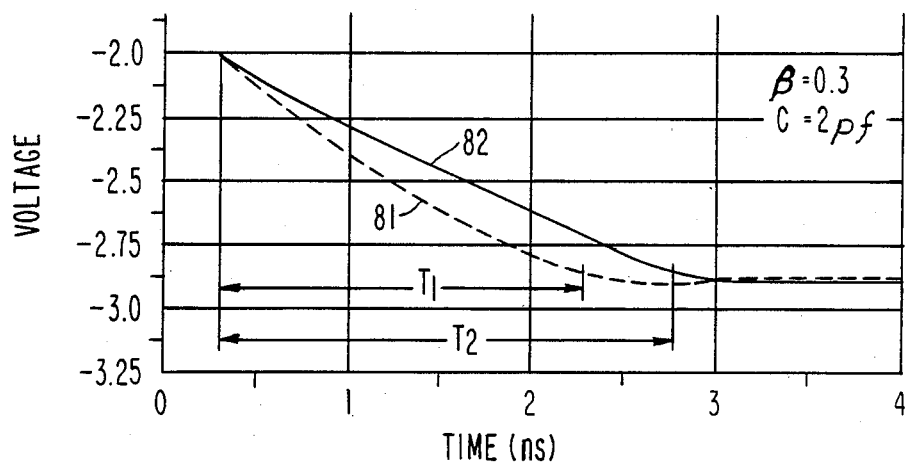
FIGS. 4 and 5 show the results of two computer simulations of the FIG. 1 circuit.

In order to evaluate the performance increase that is achieved with the present invention, the operation of the FIG. 1 circuit was simulated on a computer via a commercially available program called SPICE. FIGS. 4 and illustrate the results of this simulation.

A curve 81 in FIG. 4 illustrates the voltage across capacitor 30b under the conditions where the current gain of transistor 40 equals 0.3, capacitor 30b equals 2.0 pf, and capacitor 30a equals 0.10 pf. Also in FIG. 4, a curve 82 shows the voltage across capacitor 30b under the same conditions as given above but with transistor 40 removed from the circuit.

Inspection of curve 81 shows that with the PNP transistor 40 in place, capacitor 30b discharges in a time $T_1$ of about 2.0 nanoseconds. By comparison, curve 82 shows that when the PNP transistor 40 is removed, the discharge time of capacitor 30b is increased to a time $T_2$ of about 2.5 nanoseconds. Thus, under the above conditions, the PNP transistor 40 speeds up the operation of the FIG. 1 circuit by $(T_2-T_1)/T_2$ or about 20%.

Figure 5:
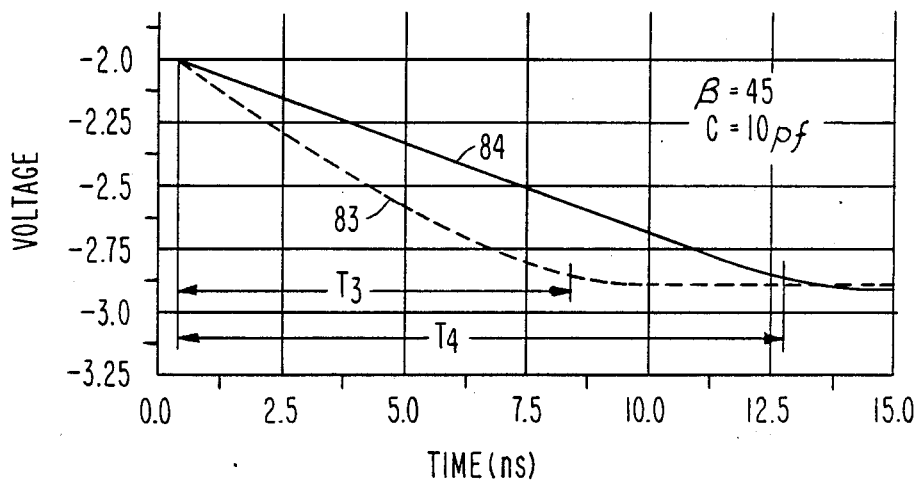

Considering now FIG. 5, there a curve 83 shows the voltage across capacitor 30b under the conditions where transistor 40 has a current gain of 45, capacitor 30b equals 10 pf, and capacitor 30a equals 0.10 pf. Also in FIG. 5, another curve 84 shows the voltage across capacitor 30b under the same conditions as above but with transistor 40 removed from the circuit. Curve 83 shows a discharge time of about 8.5 nanoseconds, whereas curve 84 shows a discharge time of about 12.5 nanoseconds. Thus, the improvement in performance is $(T_4-T_3)/T_4$ or about 33%.

Figure 6:
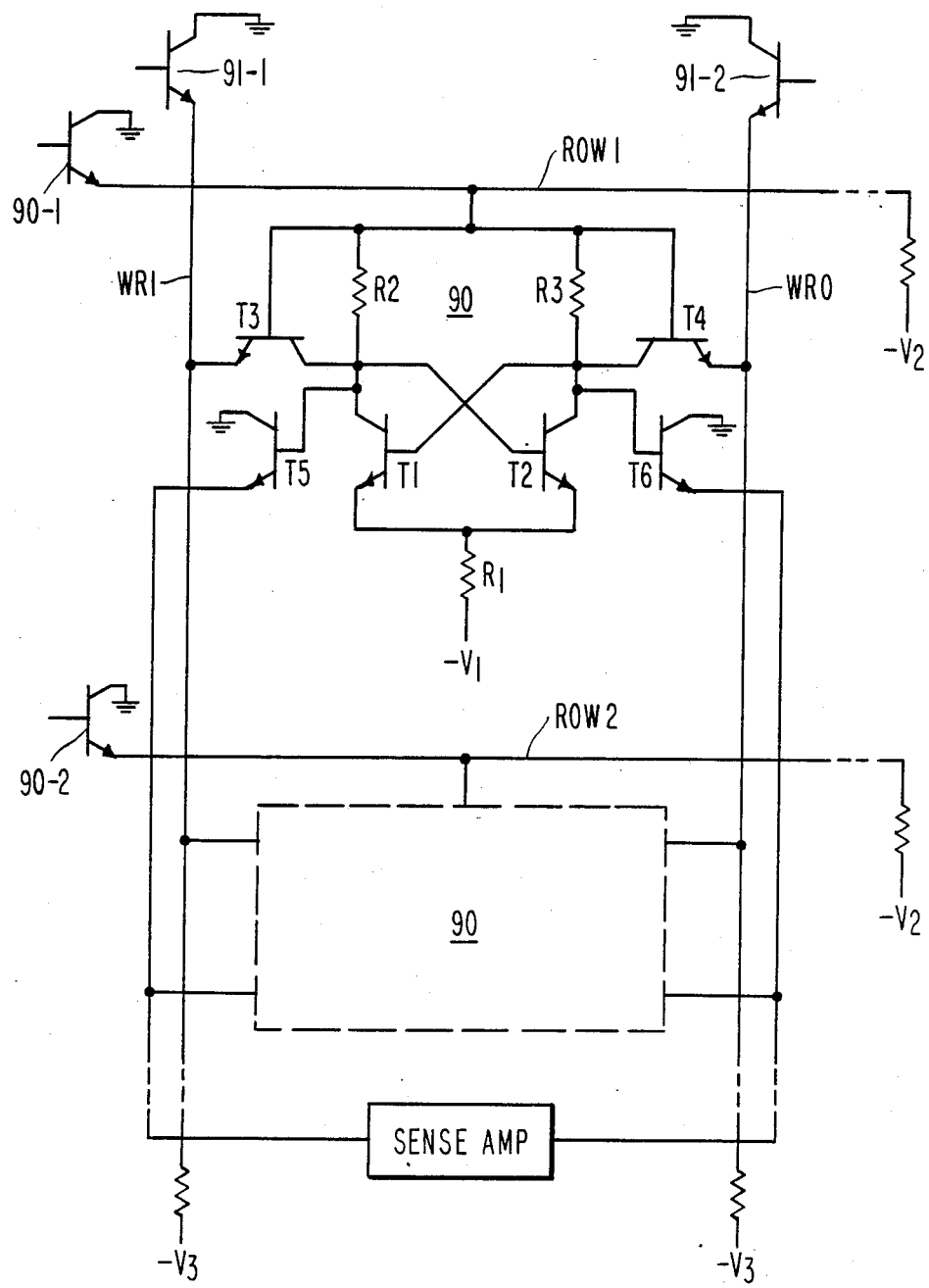
FIG. 6 shows a digital memory which incorporates the circuit of FIG. 1 to improve switching speed.

Turning now to FIG. 6, it shows a semiconductor memory in which the present invention is used. This memory includes a plurality of memory cells 90 which are arranged in an array of rows and columns. For simplicity, only two of the cells are shown. An actual array contains from sixteen to one hundred twenty-eight cells per row and per column.

Each cell of the array consists of six NPN transistors $T_1$ thru $T_6$ and three resistors $R_1$ thru $R_3$ which are interconnected as shown. Transistors $T_1$ and $T_2$ are cross-coupled and have two stable states. When a "1" is stored in a cell, current flows through resistor $R_2$, transistor $T_1$, and resistor $R_1$. Conversely, when a "0" is stored in the cell, current flows through resistor $R_3$, transistor $T_2$, and resistor $R_1$. Transistor $T_3$ is provided to write a "1" into the cell; transistor $T_4$ is provided to write a "0" into the cell; and transistors $T_5$ and $T_6$ are provided to read the cell.

Also in the FIG. 6 array, each row of cells is interconnected by a row line. One transistor 90-1 drives the first row line ROW1; another transistor 90-2 drives the second row line ROW2; etc. And, each of the transistors 90-1, 90-2 corresponds to transistor 20a of FIG. 1. Further, each of those transistors drives a parasitic capacitance which corresponds to capacitor 30b of FIG. 1.

For example, suppose that the FIG. 6 array contains 64 cells per row. Then, each of the transistors 90-1, 90-2, etc., would drive a parasitic capacitance which is associated with the 64 cells. That capacitance includes a parasitic base capacitance for the two transistors T₃ and T₄ times 64, plus a parasitic capacitance which is produced by the row line.

Each column in the FIG. 6 array further includes two other transistors 91-1 and 91-2, and they are respectively interconnected to the cells of the column by write lines WR1 and WR0. Each of those transistors 91-1 and 91-2 also corresponds to transistor 20a of FIG. 1. In addition, each of the transistors 91-1 and 91-2 drives a parasitic capacitance which corresponds to capacitor 30b of FIG. 1. For example, in the case where there are 64 memory cells per column, transistor 91-1 drives a parasitic capacitance which is produced by the emitter of transistor T₃ times 64, plus a parasitic capacitance of the line WR1 which interconnects the columns of cells.

In operation, the transistors 90-1, 90-2, etc, work in conjunction with the transistors 91-1, 91-2 to select particular cells in the array, and to read and write information to the selected cell. To accomplish that, a first control signal is applied to the base of transistors 90-1 and 90-2 such that they generate either −1.9 volts or −1.1 volts on their row line; and second control signal of either −0.8 volts or −1.4 volts is applied to the base of the transistors 91-1 and 91-2.

When the transistors 90-1 and 90-2 generate −1.9 volts on their row lines, the array is in a quiescent or deselected state. In that state, the transistors 91-1 and 91-2 have no effect on the memory cell, and so the voltage on their base can be either −0.8 volts or −1.4 volts.

To select a row of cells, the voltage on the corresponding row line is switched to −1.1 volts. In that state, data is read from the selected row of cells when −0.8 volts is applied to the base of the transistors 91-1 and 91-2. Also in that state, a "1" is written into a cell of a selected row when the voltage on the base of transistor 91-1 is switched to −1.4 volts; and a "0" is written into the cell when the voltage on the base of transistor 91-2 is switched to −1.4 volts.

Now, in order to perform the above operations quickly on various cells of the array in a random sequence, it is imperative that the voltages on the row lines ROW1, ROW2 and the write lines WR1, WR0 can be switched quickly. And to do that requires that a quick discharge of the parasitic capacitances which are associated with those lines. Such discharge, with the present invention, is achieved by the FIG. 1 circuit due to the previously described operation of the PNP transistor 40.

A preferred embodiment of the invention has now been described in detail. In addition, however, many changes and modifications can be made to these details without departing from the nature and spirit of the invention. Accordingly, it is understood that the invention is not limited to the above details but is defined by the appended claims.

What is claimed is:

1. A speed-up circuit, in a semiconductor chip of the type that includes a P-type substrate with a plurality of components integrated into a surface thereof; said components including a first NPN transistor having a base which receives a control signal, a collector coupled to a voltage bus, and an emitter which drives a first resistor plus a base of a second NPN transistor plus a small capacitance; said second NPN transistor having a collector coupled to a voltage bus, and an emitter which drives a second resistor plus a large capacitance; wherein said speed-up circuit is comprised of:
a PNP transistor having an emitter coupled to said large capacitance, a base coupled to a tap on said first resistor, and a collector coupled to said substrate;
the emitter and base of said PNP transistor consisting of doped regions in said substrate which respectively extend to the same depth below said surface as the base and collector of each NPN transistor, and said collector of said PNP transistor being the entire substrate below said components in said surface.

2. A circuit according to claim 1 wherein the emitter of said PNP transistor and the base of each NPN transistor extend from said surface of said substrate to the same first depth, and the base of said PNP transistor and the collector of each NPN transistor extend from said surface to the same second depth.

3. A circuit according to claim 2 wherein the base of said PNP transistor and the collector of said NPN transistors have doping profiles which are the same.

4. A circuit according to claim 3 wherein said tap produces a voltage when both said large and small capacitances are charged which forward biases the base-emitter of said PNP transistor without turning said PNP transistor on.

5. A circuit according to claim 4 wherein said collector of each NPN transistor includes an N region which makes an aligned contact with an N+ region, while said base of said PNP transistor includes an N region which makes an offset contact with an N+ region.

6. A speed-up circuit in a semiconductor substrate of the type that includes a first node having a small capacitance, a second node having a large capacitance, a first NPN transistor coupled to said first node for charging said small capacitance, a second NPN transistor coupled between said first and second nodes for charging said large capacitance when said small capacitance charges, and a means for discharging said small capacitance; wherein said speedup circuit is comprised of:
a PNP transistor having an emitter coupled to said large capacitance, a base coupled to said means for discharging, and a collector coupled to said substrate;
the emitter of said PNP transistor and the base of each NPN transistor consisting of doped regions in said substrate which extend from a surface thereof to the same first depth, the base of said PNP transistor and the collector of each NPN transistor consisting of doped regions in said substrate which extend from said surface to the same second depth, and the collector of said PNP transistor consisting of the entire substrate below said second depth.

7. A circuit according to claim 6 wherein said discharging means produces a voltage when both said large and small capacitances are charged which forward biases the base-emitter of said PNP transistor without turning said PNP transistor on.

8. A circuit according to claim 6 wherein said collectors of said NPN transistors include an N region which is aligned with and which contacts an N+ region, while said base of said PNP transistor includes similarly shaped N and N+ regions which are offset yet still in contact with each other.

9. A circuit according to claim 6 wherein said large capacitance is (0.5–50)pf and said small capacitance is (0.005–0.5)pf.

10. A circuit according to claim 6 wherein said large capacitance is at least ten times said small capacitance.

11. A circuit according to claim 6 wherein said large capacitance includes a plurality of emitters of respective NPN transistors with each emitter being an input terminal for writing data into a memory cell.

* * * * *